(12) United States Patent
Chang

(10) Patent No.: US 12,354,700 B2
(45) Date of Patent: Jul. 8, 2025

(54) MEMORY DEVICE AND OPERATION METHOD THEREOF

(71) Applicant: eMemory Technology Inc., Hsinchu (TW)

(72) Inventor: Chia-Fu Chang, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 178 days.

(21) Appl. No.: 18/474,194

(22) Filed: Sep. 25, 2023

(65) Prior Publication Data

US 2024/0161788 A1    May 16, 2024

Related U.S. Application Data

(60) Provisional application No. 63/424,966, filed on Nov. 14, 2022.

(51) Int. Cl.
G11C 7/06         (2006.01)

(52) U.S. Cl.
CPC ..................... G11C 7/065 (2013.01)

(58) Field of Classification Search
CPC ....................................... G11C 7/065
USPC ............................................. 365/207
See application file for complete search history.

(56) References Cited

U.S. PATENT DOCUMENTS

| | | | |
|---|---|---|---|
| 8,976,582 B2* | 3/2015 | Sarin | G11C 16/0483 365/207 |
| 2009/0021987 A1 | 1/2009 | Sarin et al. | |
| 2011/0080793 A1 | 4/2011 | Cheng | |
| 2014/0286079 A1* | 9/2014 | Domae | G11C 13/0069 365/148 |
| 2016/0276023 A1* | 9/2016 | Chen | G11C 16/26 |

* cited by examiner

*Primary Examiner* — Anthan Tran
(74) *Attorney, Agent, or Firm* — CKC & Partners Co., LLC

(57) ABSTRACT

A memory device includes a memory cell array and a sensing amplifier circuit. The memory cell array outputs a cell current. The sensing amplifier circuit is coupled to the memory cell array to receive the cell current. The sensing amplifier circuit includes an operational amplifier. The operational amplifier includes a first input terminal, a second input terminal, and an output terminal. The sensing amplifier circuit pulls up a voltage at the first input terminal to a first voltage by a first capacitor according to the cell current in a developing mode, and pulls up the voltage at the first input terminal to a second voltage higher than the first voltage in a boost mode after the developing mode by a second capacitor and the first capacitor. The output terminal outputs data according to the voltage and a reference voltage at the second input terminal.

20 Claims, 9 Drawing Sheets

US 12,354,700 B2

MEMORY DEVICE AND OPERATION METHOD THEREOF

RELATED APPLICATIONS

This application claims priority to U.S. Provisional Application Ser. No. 63/424,966, filed Nov. 14, 2022, which is herein incorporated by reference.

BACKGROUND

Technical Field

The present disclosure relates to memory technology. More particularly, the present disclosure relates to a memory device and an operation method thereof.

Description of Related Art

With developments of technology, various memory devices are developed. In some related approaches, in a reading process for reading a memory device, a cell current decreases rapidly due to the increase of a bit line voltage, resulting in slower reading speed.

SUMMARY

Some aspects of the present disclosure are to a memory device. The memory device includes a memory cell array and a sensing amplifier circuit. The memory cell array is configured output a cell current. The sensing amplifier circuit is coupled to the memory cell array to receive the cell current. The sensing amplifier circuit includes an operational amplifier. The operational amplifier includes a first input terminal, a second input terminal, and an output terminal. The sensing amplifier circuit is configured to pull up a voltage at the first input terminal to a first voltage by a first capacitor according to the cell current in a developing mode, and pull up the voltage at the first input terminal to a second voltage higher than the first voltage in a boost mode after the developing mode by a second capacitor and the first capacitor. The output terminal is configured to output data according to the voltage at the first input terminal and a reference voltage at the second input terminal.

Some aspects of the present disclosure are to provide an operation method for a memory device. The operation method includes following operations: outputting, by a memory cell array in the memory device, a cell current; receiving, by a sensing amplifier circuit in the memory device, the cell current; pulling up, by a first capacitor in the sensing amplifier circuit, a voltage at a first input terminal of an operational amplifier in the sensing amplifier circuit to a first voltage according to the cell current in a developing mode; pulling up, by a second capacitor in the sensing amplifier circuit and the first capacitor, the voltage at the first input terminal to a second voltage higher than the first voltage in a boost mode after the developing mode; and outputting, by an output terminal of the operational amplifier, data according to the voltage at the first input terminal and a reference voltage at a second input terminal of the operational amplifier.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
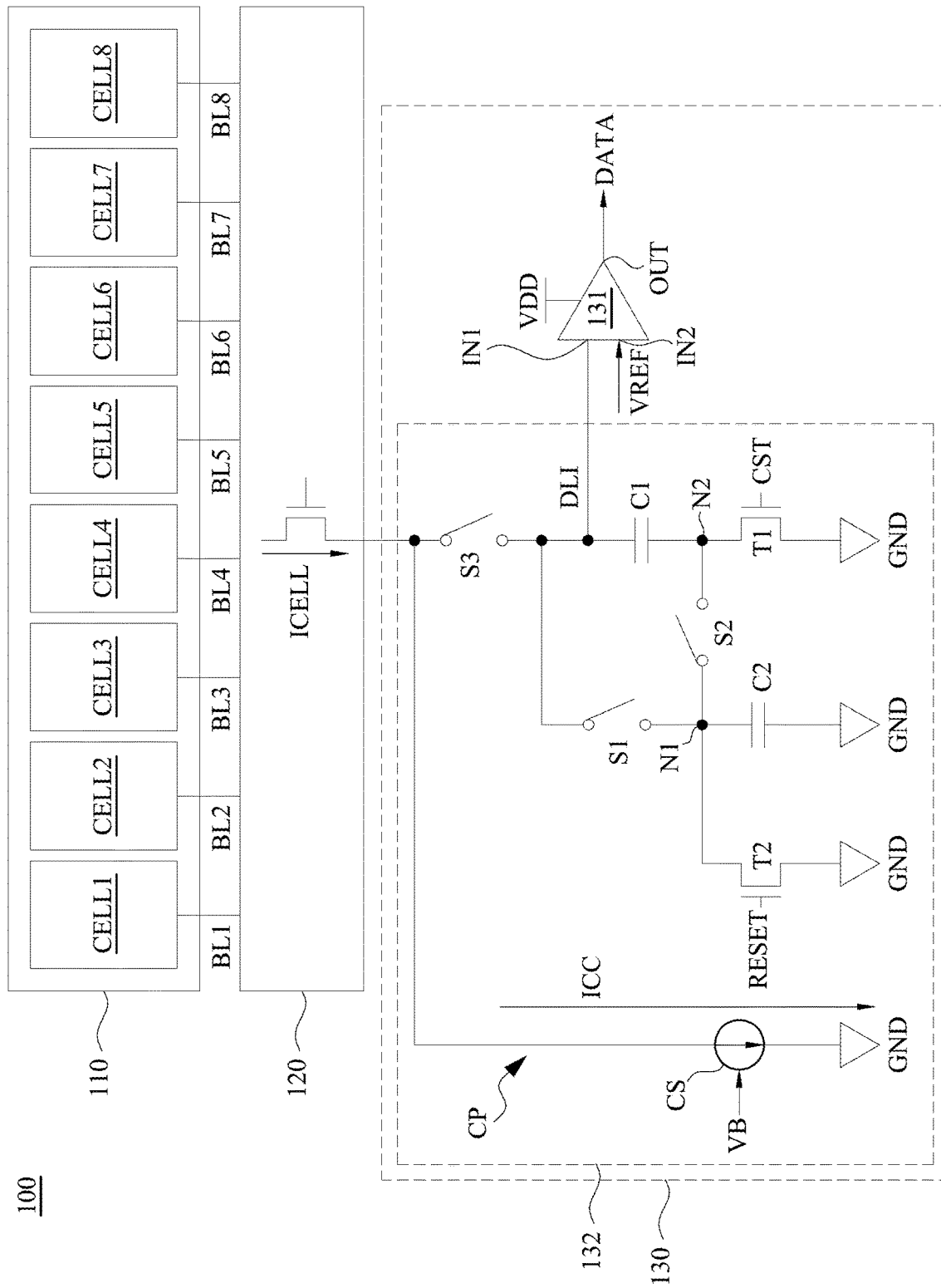
FIG. 1 is a schematic diagram illustrating a memory device according to some embodiments of the present disclosure.

Reference is made to FIG. 1. FIG. 1 is a schematic diagram illustrating a memory device 100 according to some embodiments of the present disclosure.

As illustrated in FIG. 1, the memory device 100 includes a memory cell array 110, a decoder 120, and a sensing amplifier circuit 130. The decoder 120 is coupled between the memory cell array 110 and the sensing amplifier circuit 130.

The memory cell array 110 includes memory cells CELL1-CELL8. In some embodiments, the memory cells CELL1-CELL8 are implemented by antifuse transistor type memory cells, but the present disclosure is not limited thereto. The memory cells CELL1-CELL8 are coupled to bit lines BL1-BL8 respectively. The quantities of the memory cells and the bit lines in FIG. 1 are merely for illustration, and the present disclosure is not limited to the quantities. Other suitable quantities are within the contemplated scopes of the present disclosure.

The decoder 120 is coupled to the bit lines BL1-BL8 and works as a selector to select one of the bit lines BL1-BL8. The selected bit line outputs a cell current ICELL in a reading process through the decoder 120 to the sensing amplifier circuit 130.

The sensing amplifier circuit 130 is coupled to the decoder 120 to receive the cell current ICELL, and is used to output data DATA according to the cell current CELL. As illustrated in FIG. 1, the sensing amplifier circuit 130 includes an operational amplifier 131 and a control circuit 132.

The operational amplifier 131 includes an input terminal (e.g., positive input terminal) IN1, an input terminal (e.g., negative input terminal) IN2, and an output terminal OUT. The operational amplifier 131 operates based on a power voltage VDD and is used to output data DATA at the output terminal OUT according to voltages at the input terminal IN1 and at the input terminal IN2.

The control circuit 132 is coupled the operational amplifier 131. The control circuit 132 includes a switch S1, a switch S2, a switch S3, a capacitor C1, a capacitor C2, and a transistor T1. In some embodiments, the control circuit 132 further includes a transistor T2. The switch S3 is coupled between the decoder 120 (i.e., the aforementioned selected bit line) and the input terminal IN1. A first terminal of the capacitor C1 is coupled to the switch S3 at the input terminal IN1. A first terminal of the switch S1 is coupled to the input terminal IN1. A first terminal of the switch S2 is coupled to a second terminal of the switch S1 and a first terminal of the capacitor C2 at a node N1. A second terminal of the switch S2 is coupled to a second terminal of the capacitor C1 at a node N2. A second terminal of the capacitor C2 is coupled to a ground terminal GND. The transistor T1 is coupled between the second terminal of the capacitor C1 (i.e., the node N2) and the ground terminal GND, and is controlled by a control signal CST. In some embodiments, in reset mode, developing mode, isolation mode, and boost mode, a logic value of the control signal CST for controlling the transistor T1 is identical to a logic value of a control signal for controlling the switch S1. The transistor T2 is coupled between the second terminal of the switch S1 (i.e., the node N1) and the ground terminal GND, and is controlled by a reset signal RESET to form a reset path. In practical applications, a capacitance value of the capacitor C2 is greater than a capacitance value of the capacitor C1.

In some embodiments, the control circuit 132 further includes a cancelling path CP. The cancelling path CP is coupled between the decoder 120 (i.e., the aforementioned selected bit line) and the ground terminal GND. As illustrated in FIG. 1, the cancelling path CP is formed by a current source CS which is controlled by a bias voltage VB, and a cancelling current ICC can flow through the cancelling path CP to leak some leakage currents or off-state currents to the ground terminal GND.

Figure 2:
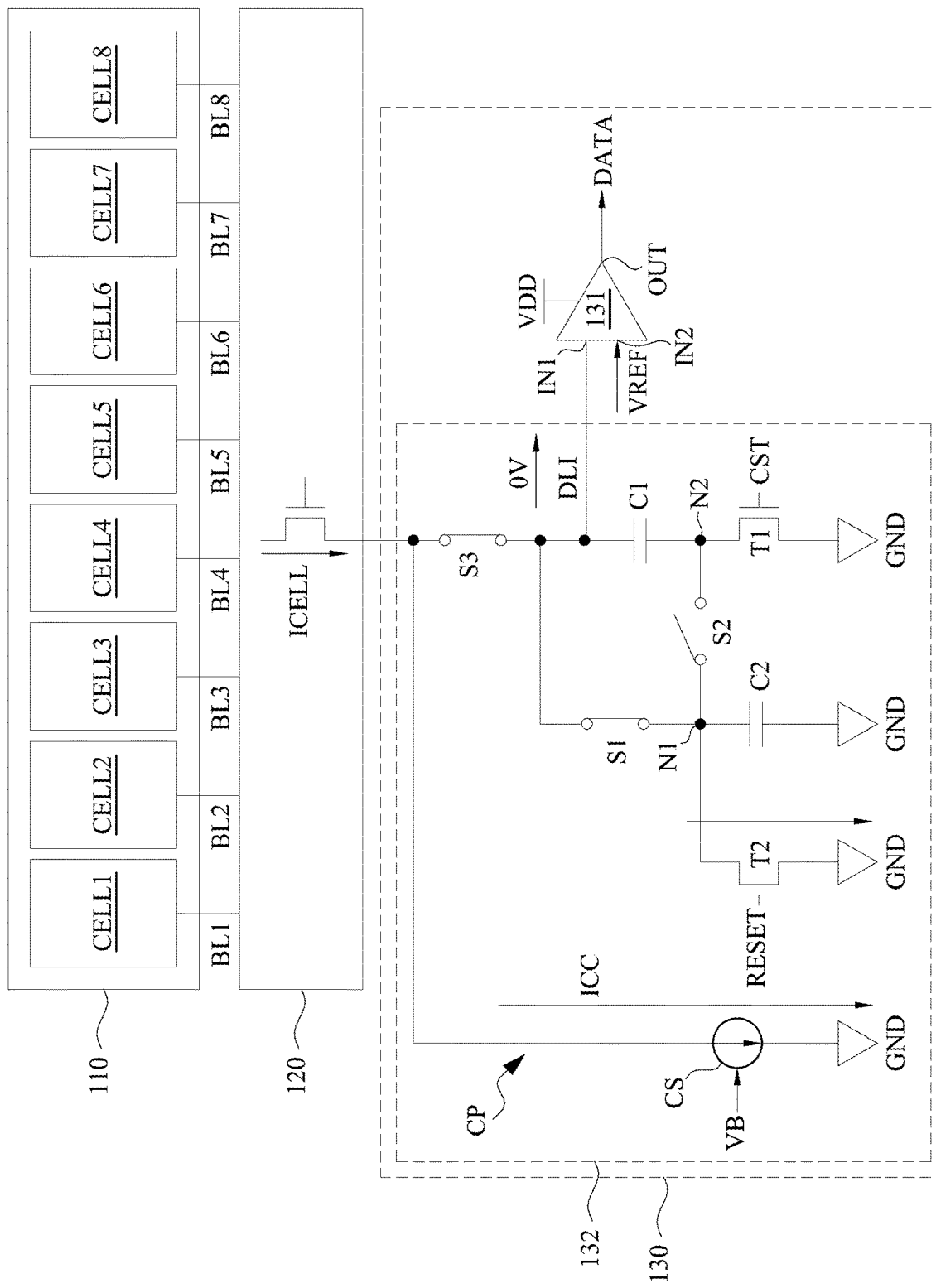
FIG. 2 is a schematic diagram illustrating the memory device in FIG. 1 in a reset mode according to some embodiments of the present disclosure.

Reference is made to FIG. 2. FIG. 2 is a schematic diagram illustrating the memory device 100 in FIG. 1 in a reset mode according to some embodiments of the present disclosure.

In the reset mode, the switch S3, the switch S1, the transistor T1, and the transistor T2 are turned on, and the switch S2 is turned off. Accordingly, a voltage DLI at the first terminal of the capacitor C1 (i.e., the input terminal IN1) and a voltage at the first terminal of the capacitor C2 (i.e., the node N1) are pulled down to a ground voltage (e.g., 0 volt) of the ground terminal GND. In other words, the voltage DLI at the input terminal IN1 and the voltage at the node N1 can be reset to the ground voltage.

Figure 3:
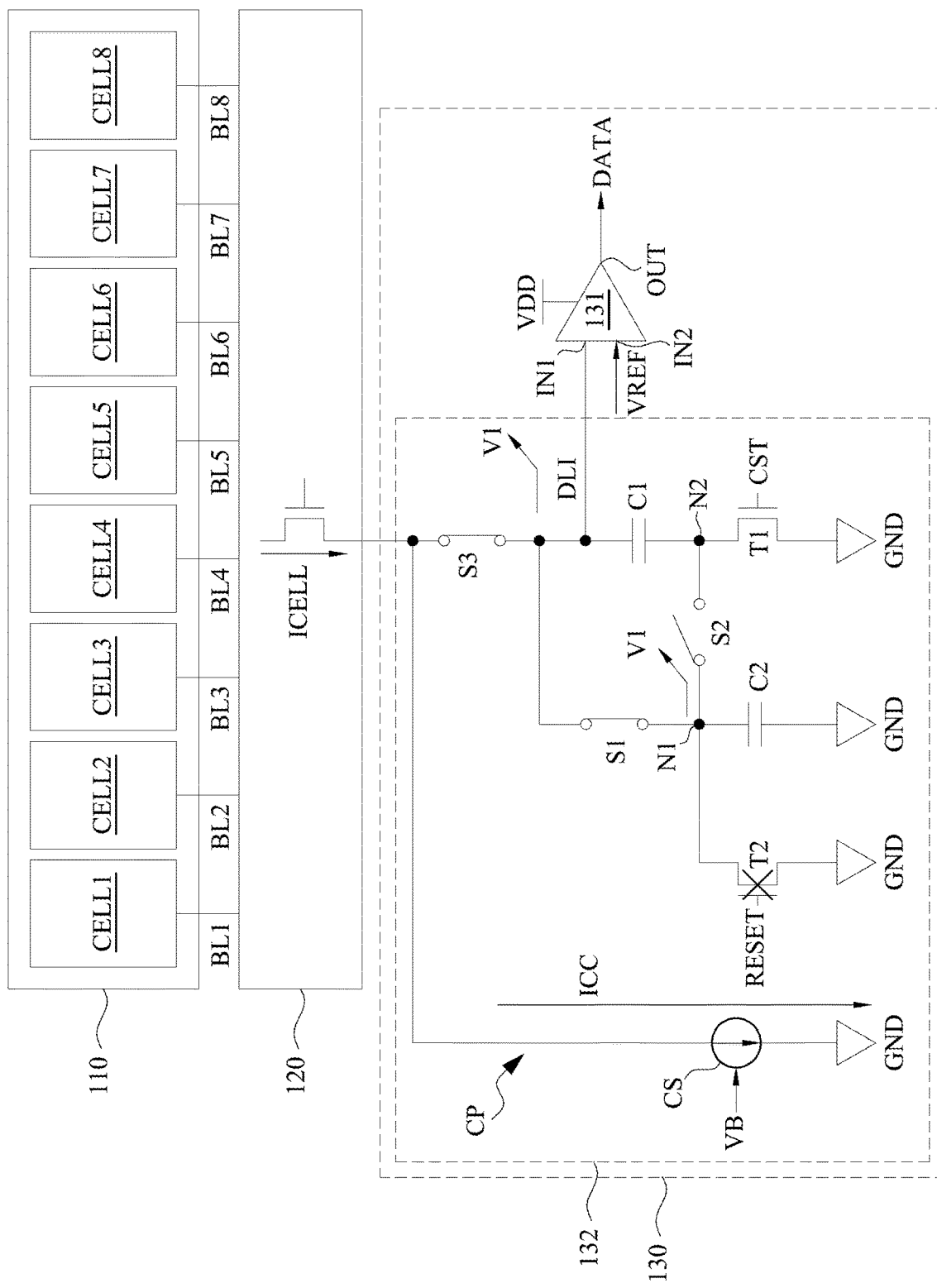
FIG. 3 is a schematic diagram illustrating the memory device in FIG. 1 in a developing mode according to some embodiments of the present disclosure.

Reference is made to FIG. 3. FIG. 3 is a schematic diagram illustrating the memory device 100 in FIG. 1 in a developing mode according to some embodiments of the present disclosure.

In the developing mode after the reset mode, the switch S3, the switch S1, and the transistor T1 are turned on, and the switch S2 and the transistor T2 are turned off. Accordingly, the cell current ICELL can be used to charge the first terminal of the capacitor C1 (i.e., the input terminal IN1) through the turned-on switch S3 such that the voltage DLI at the input terminal IN1 increases to a first voltage V1. In addition, the cell current ICELL can also be used to charge the first terminal of the capacitor C2 (i.e., the node N1) through the turned-on switch S1 such that the voltage at the node N1 also increases to the first voltage V1.

Figure 4:
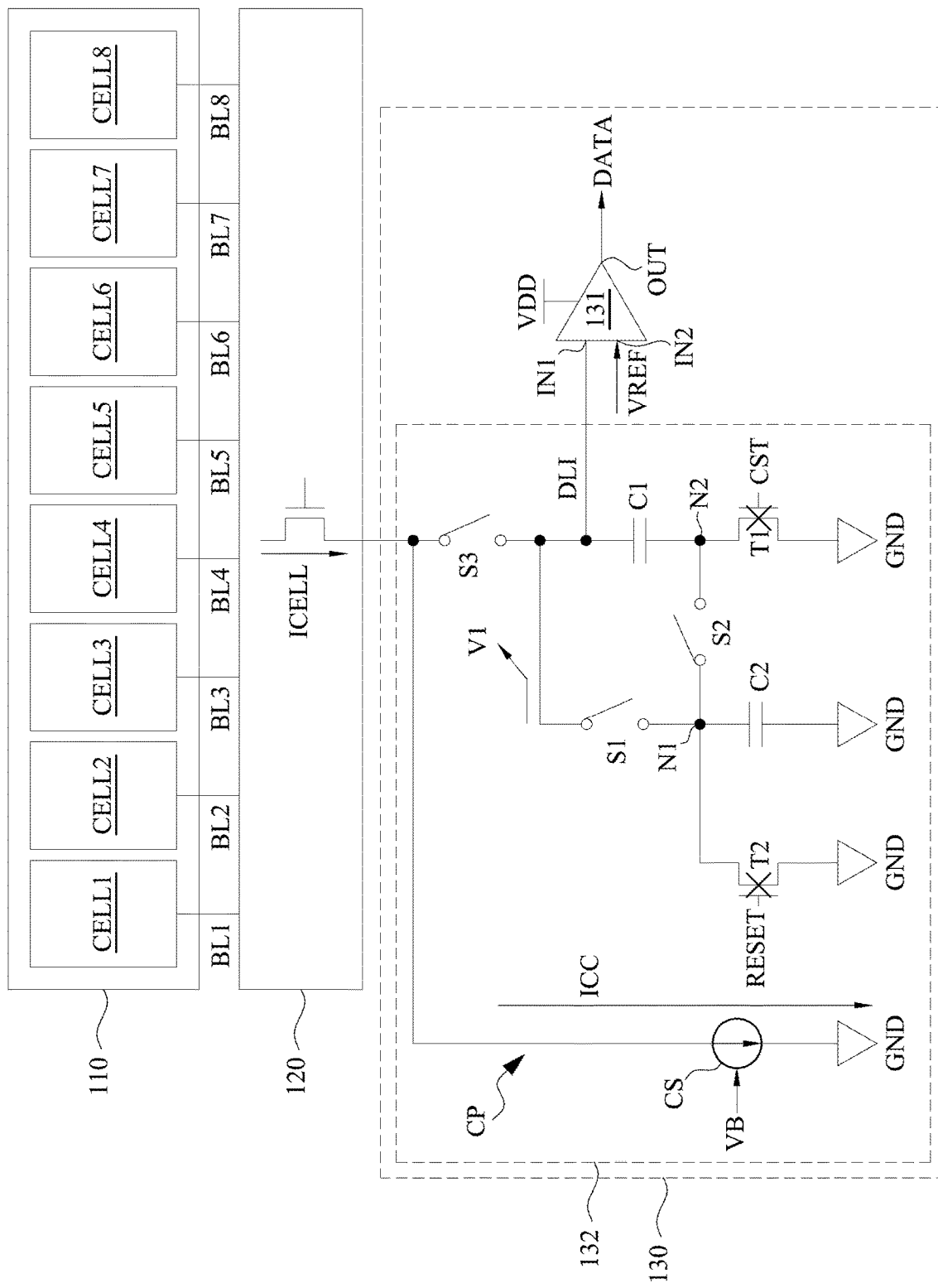
FIG. 4 is a schematic diagram illustrating the memory device in FIG. 1 in an isolation mode according to some embodiments of the present disclosure.

Reference is made to FIG. 4. FIG. 4 is a schematic diagram illustrating the memory device 100 in FIG. 1 in an isolation mode according to some embodiments of the present disclosure.

In the isolation mode after the developing mode, the switch S3, the switch S1, the switch S2, the transistor T1, and the transistor T2 are turned off. Thus, the voltages at the input terminal IN1, at the node N1, and the node N2 are isolated from each other.

Figure 5:
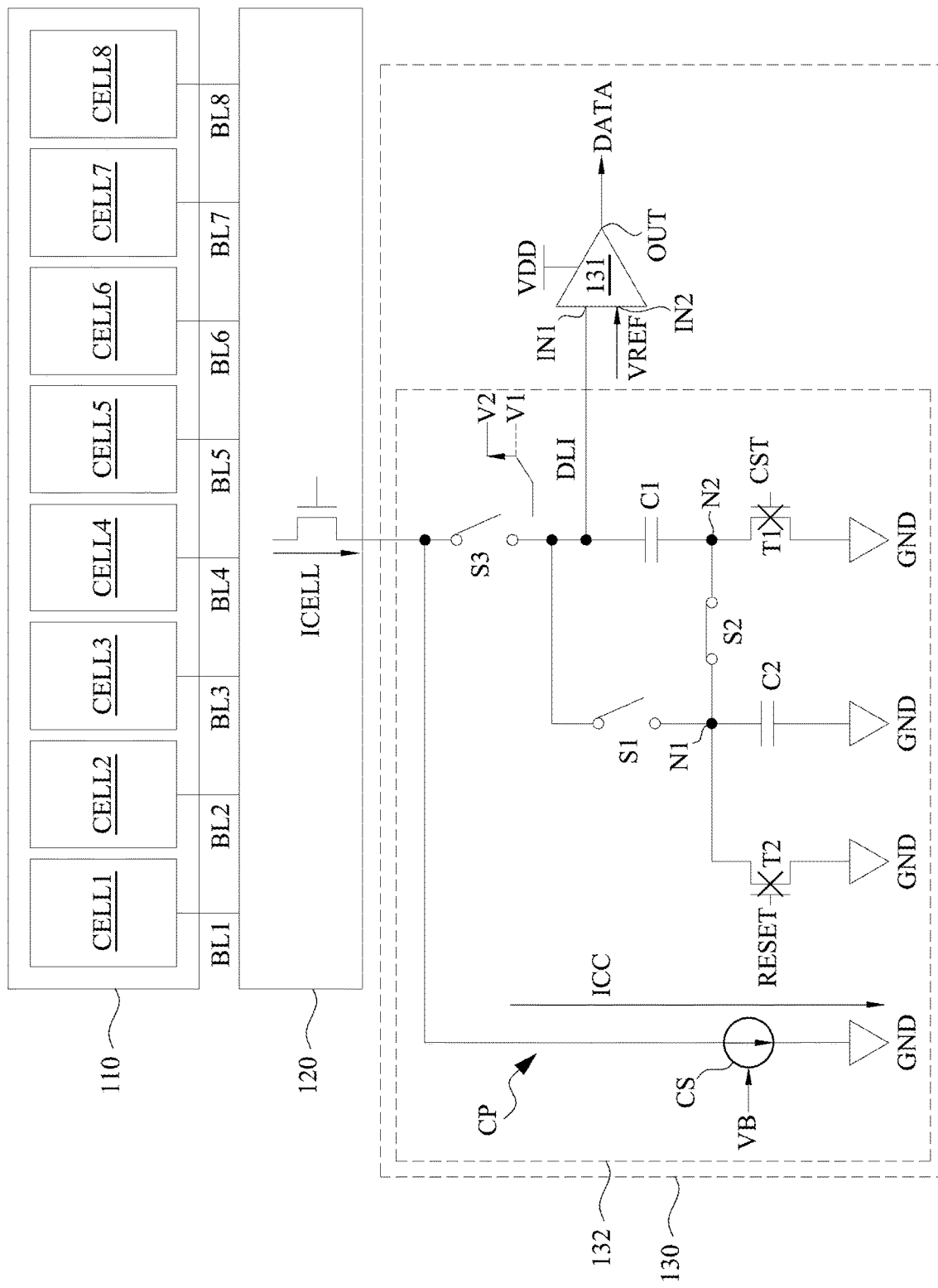
FIG. 5 is a schematic diagram illustrating the memory device in FIG. 1 in a boost mode according to some embodiments of the present disclosure.

Reference is made to FIG. 5. FIG. 5 is a schematic diagram illustrating the memory device 100 in FIG. 1 in a boost mode according to some embodiments of the present disclosure.

In the boost mode after the isolation mode, the switch S2 is turned on, and the switch S3, the switch S1, the transistor T1, and the transistor T2 are turned off. Since the first terminal of the capacitor C2 (i.e., the node N1) has been charged to the first voltage V1 in the previous developing mode and the capacitance value of the capacitor C2 is greater than the capacitance value of the capacitor C1 as described above, the voltage DLI at the first terminal of the capacitor C1 (i.e., the input terminal IN1) is further charged to a second voltage V2 higher than the first voltage V1 through the turned-on switch S2 and the capacitor C1 based on the first voltage V1 at the first terminal of the capacitor C2 (i.e., the node N1). Explained in another way, the voltage DLI at the first terminal of the capacitor C1 (i.e., the input terminal IN1) is pulled to the first voltage V1 by charges stored in the capacitor C1, and the voltage DLI at the first terminal of the capacitor C1 (i.e., the input terminal IN1) is pulled to the second voltage V2 higher than the first voltage V1 by charges stored in the capacitor C2 (through the turned-on switch S2 and the capacitor C1). In some embodiments, the second voltage V2 can be two times the first voltage V1.

Then, the operational amplifier 131 can output the data DATA at the output terminal OUT according the voltage DLI at the input terminal IN1 and the reference voltage VREF at the input terminal IN2. The operational amplifier 131 can further transmit the data DATA to a latch or a buffer to complete the reading process.

In some related approaches, in a reading process for reading a memory device, a cell current decreases rapidly due to the increase of a bit line voltage, resulting in slower reading speed.

Compared to the related approaches, the sensing amplifier circuit 130 of the present disclosure can pull up the voltage DLI to the first voltage V1 according to the cell current ICELL (still larger) by the capacitor C1 in the developing mode, and further pull up the voltage DLI to the higher second voltage V2 in the boost mode by the charges stored in the capacitor C2 (through the turned-on switch S2 and the capacitor C1). Then, the sensing amplifier circuit 130 of the present disclosure can output the data DADA according to the voltage DLI and the reference voltage VREF. Since the voltage DLI is pulled up to the higher voltage, the reading speed can be accelerated.

Figure 6:
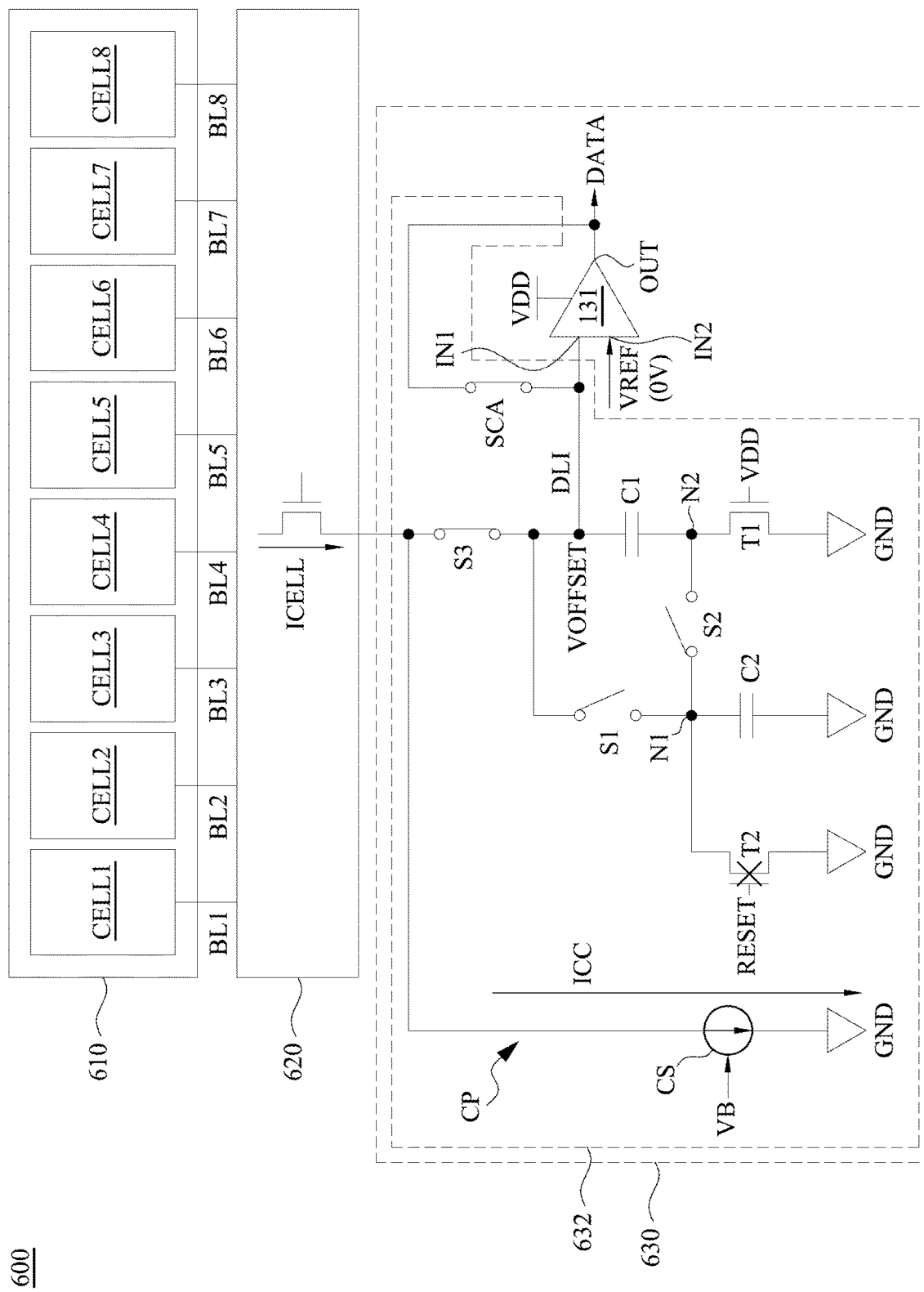
FIG. 6 is a schematic diagram illustrating a memory device in a calibration mode according to some embodiments of the present disclosure.

Reference is made to FIG. 6. FIG. 6 is a schematic diagram illustrating a memory device 600 in a calibration mode according to some embodiments of the present disclosure.

As illustrated in FIG. 6, the memory device 600 includes a memory cell array 610, a decoder 620, and a sensing amplifier circuit 630. The memory cell array 610 and the decoder 620 are similar to the memory cell array 110 and the decoder 120 in FIG. 1, so they are not described herein again.

The major difference between the sensing amplifier circuit 630 and the sensing amplifier circuit 130 in FIG. 1 is that the sensing amplifier circuit 630 further includes a switch SCA. The switch SCA is coupled between the output terminal OUT and the input terminal IN1. In some embodiments, the calibration mode in FIG. 6 is added between the reset mode in FIG. 2 and the developing mode in FIG. 3. In the calibration mode, the switch S3, the switch SCA, and the transistor T1 are turned on, the switch S1, the switch S2, the transistor T2 are turned off, and the reference voltage VREF at the input terminal IN2 is the ground voltage (e.g., 0 volt). Since the first terminal of the capacitor C1 (i.e., the input terminal IN1) is reset to the ground voltage in the reset mode in FIG. 2, an offset voltage VOFFSET caused by mismatch of the operational amplifier 131 reflected at the output terminal OUT can be stored back at the first terminal of the capacitor C1 (i.e., the input terminal IN1) through the tuned-on switch SCA. The offset voltage VOFFSET stored at the input terminal IN1 can be used to cancel the mismatch of the operational amplifier 131 in subsequent modes. In addition, in the example of FIG. 6, the transistor T1 is controlled by the power voltage VDD.

Figure 7:
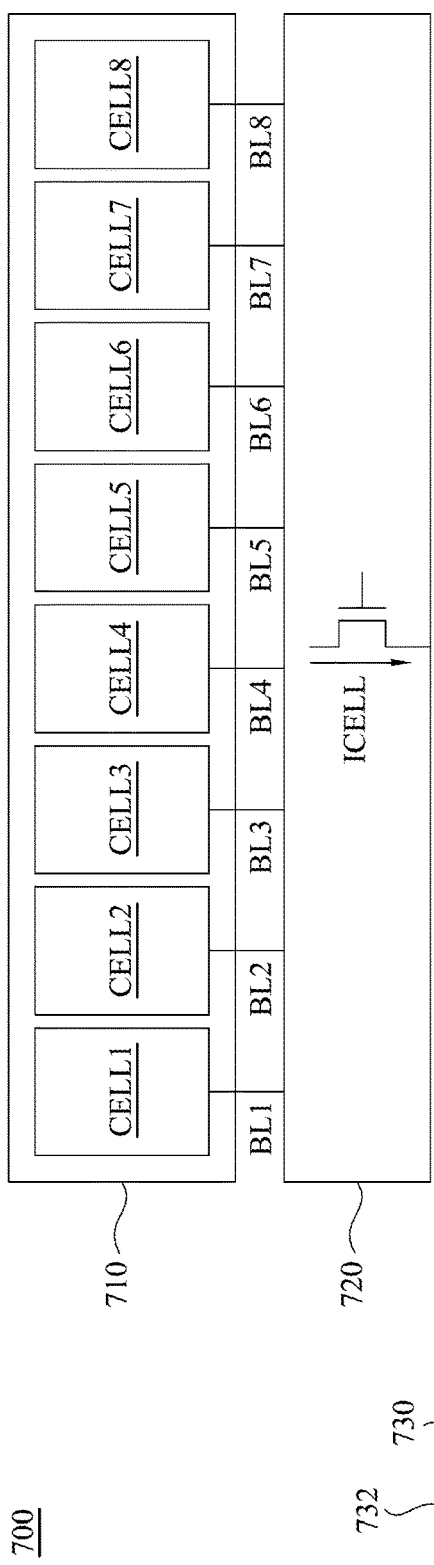
FIG. 7 is a schematic diagram illustrating a memory device according to some embodiments of the present disclosure.
Figure 7:
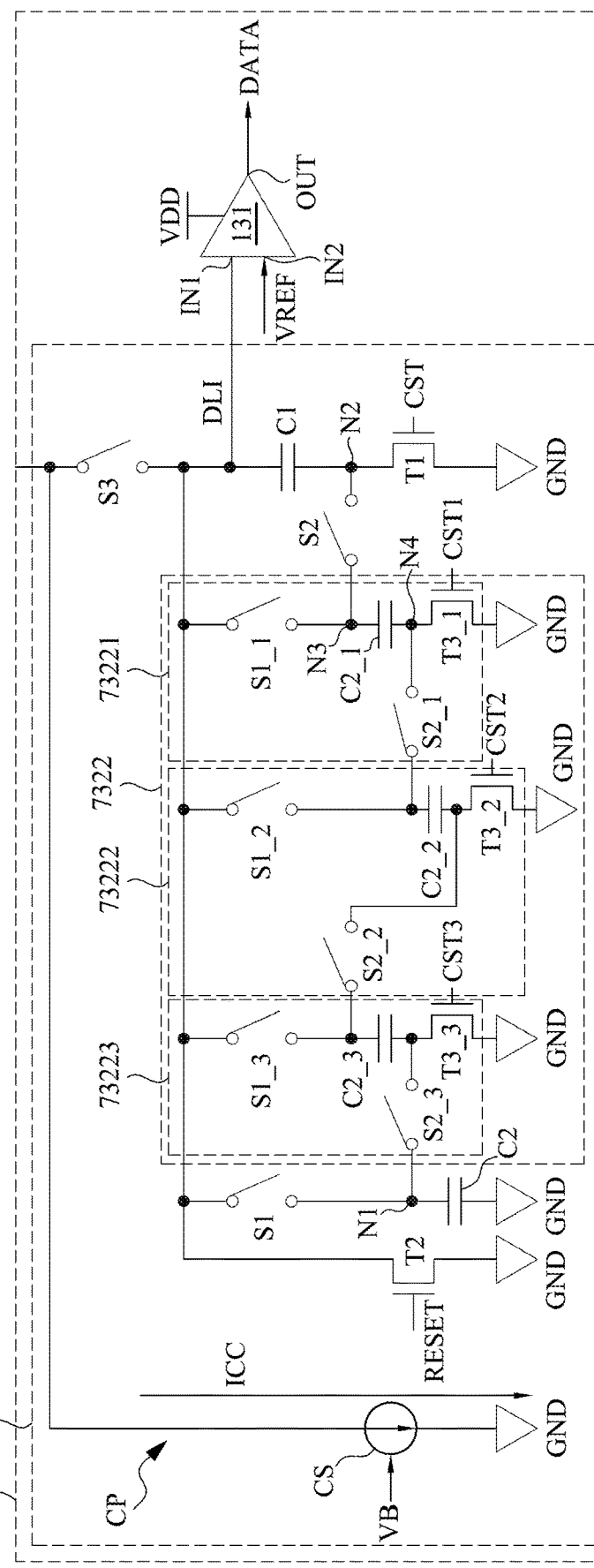

Reference is made to FIG. 7. FIG. 7 is a schematic diagram illustrating a memory device 700 in a calibration mode according to some embodiments of the present disclosure.

As illustrated in FIG. 7, the memory device 700 includes a memory cell array 710, a decoder 720, and a sensing amplifier circuit 730. The memory cell array 710 and the decoder 720 are similar to the memory cell array 110 and the decoder 120 in FIG. 1, so they are not described herein again.

The major difference between the sensing amplifier circuit 730 and the sensing amplifier circuit 130 in FIG. 1 is that the sensing amplifier circuit 730 further includes a multi-stage boost circuit 7322. The multi-stage boost circuit 7322 is coupled between the first terminal of the capacitor C2 and the first terminal of the switch S2. The multi-stage boost circuit 7322 is used to pull the voltage DLI at the input terminal IN1 to a further higher voltage.

The multi-stage boost circuit 7322 includes stage circuits 73221-73223. The stage circuit 73221 includes a switch S1_1, a capacitor C2_1, a transistor T3_1, and a switch S2_1. The switch S1_1 is coupled between the input terminal IN1 and a node N3 (i.e., the first terminal of the switch S2). The capacitor C2-1 is coupled between the node N3 (i.e., the first terminal of the switch S2) and a terminal of the transistor T3_1 (i.e. a node N4). The capacitor C2-1 and the switch S1_1 are coupled to the switch S2 at the node N3 such that the capacitors C2-1 and C1 can be coupled in series through the switch S2. The transistor T3_1 is coupled to the capacitor C2-1 and the ground terminal GND. A first terminal of the switch S2_1 is coupled to a terminal of the capacitor C2_2 in the previous stage circuit 73222. A second terminal of the switch S2_1 is coupled a node N4 between the capacitor C2-1 and the transistor T3_1. Accordingly, the capacitors C2-1 and C2-2 can be coupled in series through the switch S2_1 In some embodiments, a logic value of a control signal CST1 for controlling the transistor T3_1 is identical to a logic value of a control signal for controlling the switch S1_1.

The stage circuit 73222 includes a switch S1_2, a capacitor C2_2, a transistor T3_2, and a switch S2_2. The stage circuit 73223 includes a switch S1_3, a capacitor C2_3, a transistor T3_3, and a switch S2_3. In some embodiments, a logic value of a control signal CST2 for controlling the transistor T3_2 is identical to a logic value of a control signal for controlling the switch S1_2, and a logic value of a control signal CST3 for controlling the transistor T3_3 is identical to a logic value of a control signal for controlling the switch S1_3. In some embodiments, the switches S2_3, S2_2, and S2_1 can be turned on simultaneously or serially (from switch S2_3 to switch S2_1). Since other stage circuits 73222-73223 have similar structures, they are not described herein again. The quantity of the stage circuits, for example, 3 stage circuits 73221-73223, in FIG. 7 is merely for illustrative purposes, and the present disclosure is not limited to the quantity. Other suitable quantities are within the contemplated scopes of the present disclosure. For instance, the multi-stage boost circuit 7322 may include n stage circuits, in which n is greater than 3.

Figure 8:
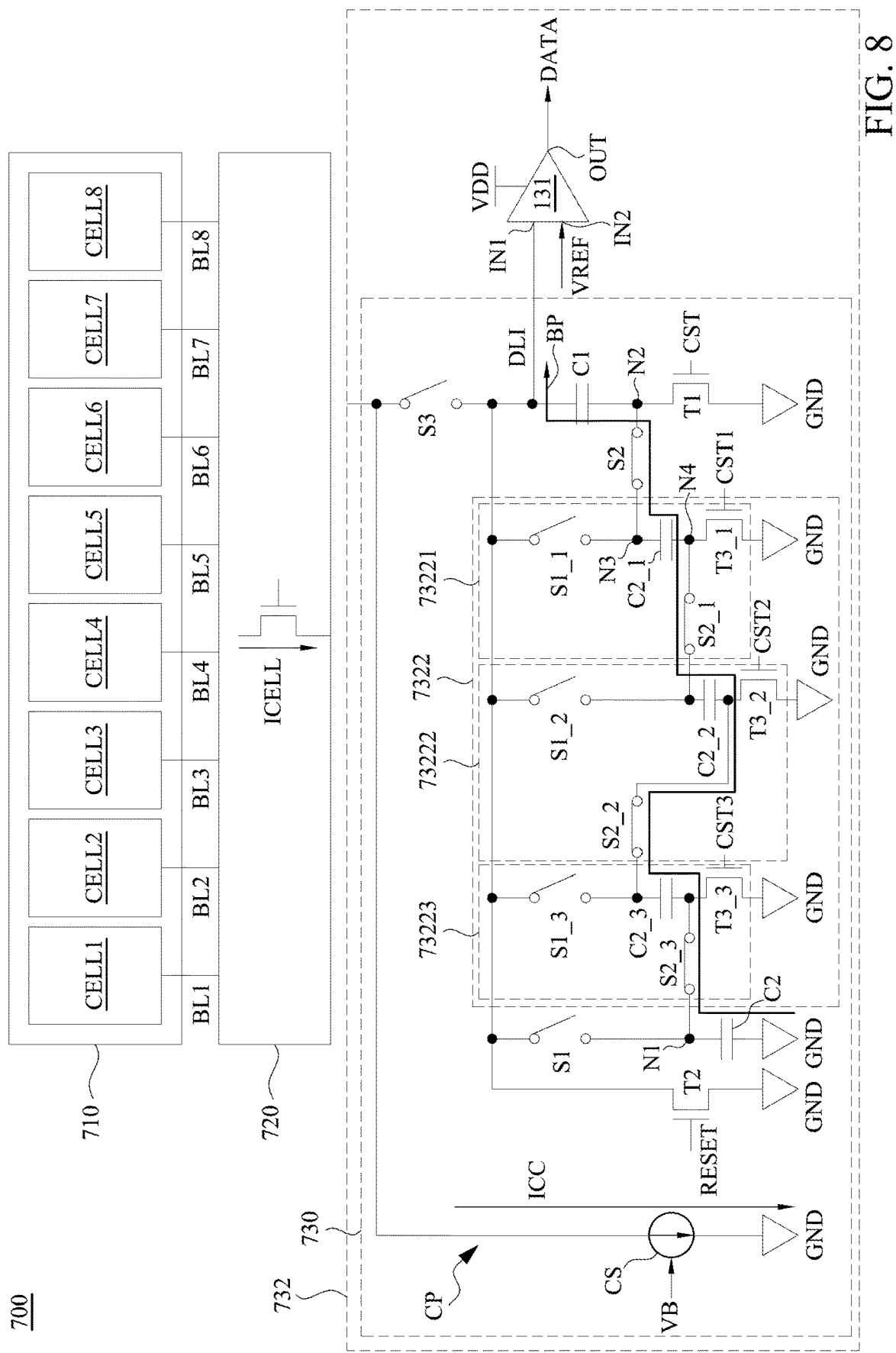
FIG. 8 is a schematic diagram illustrating a boost path of the memory device in FIG. 7 according to some embodiments of the present disclosure.

Reference is made to FIG. 8. FIG. 8 is a schematic diagram illustrating a boost path BP of the memory device 700 in FIG. 7 according to some embodiments of the present disclosure.

As illustrated in FIG. 8, the boost path BP includes the capacitor C2, the tuned-on switch S2_3, the capacitor C2_3, the turned-on switch S2_2, the capacitor C2_2, the turned-on switch S2_1, the capacitor C2_1, the turned-on switch S2, and the capacitor C1, and the voltage DLI can be pulled to a third voltage higher than the second voltage V2 by charges stored in the capacitors C2_1, C2_2, and C2_3. In some embodiments, the third voltage can be five times the first voltage V1, that is, compared with the second voltage V2, the voltage DLI is pulled additional by three times the first voltage V1. In practical applications, a capacitance value of the capacitor C2 is greater than a capacitance value of the capacitor C2_3, the capacitance value of the capacitor C2-3 is greater than a capacitance value of the capacitor C2_2, the capacitance value of the capacitor C2-2 is greater than a capacitance value of the capacitor C2_1, and the capacitance value of the capacitor C2-1 is greater than a capacitance value of the capacitor C1. The boost path BP can be used to pull the voltage DLI at the input terminal IN1 to the further higher voltage.

Figure 9:
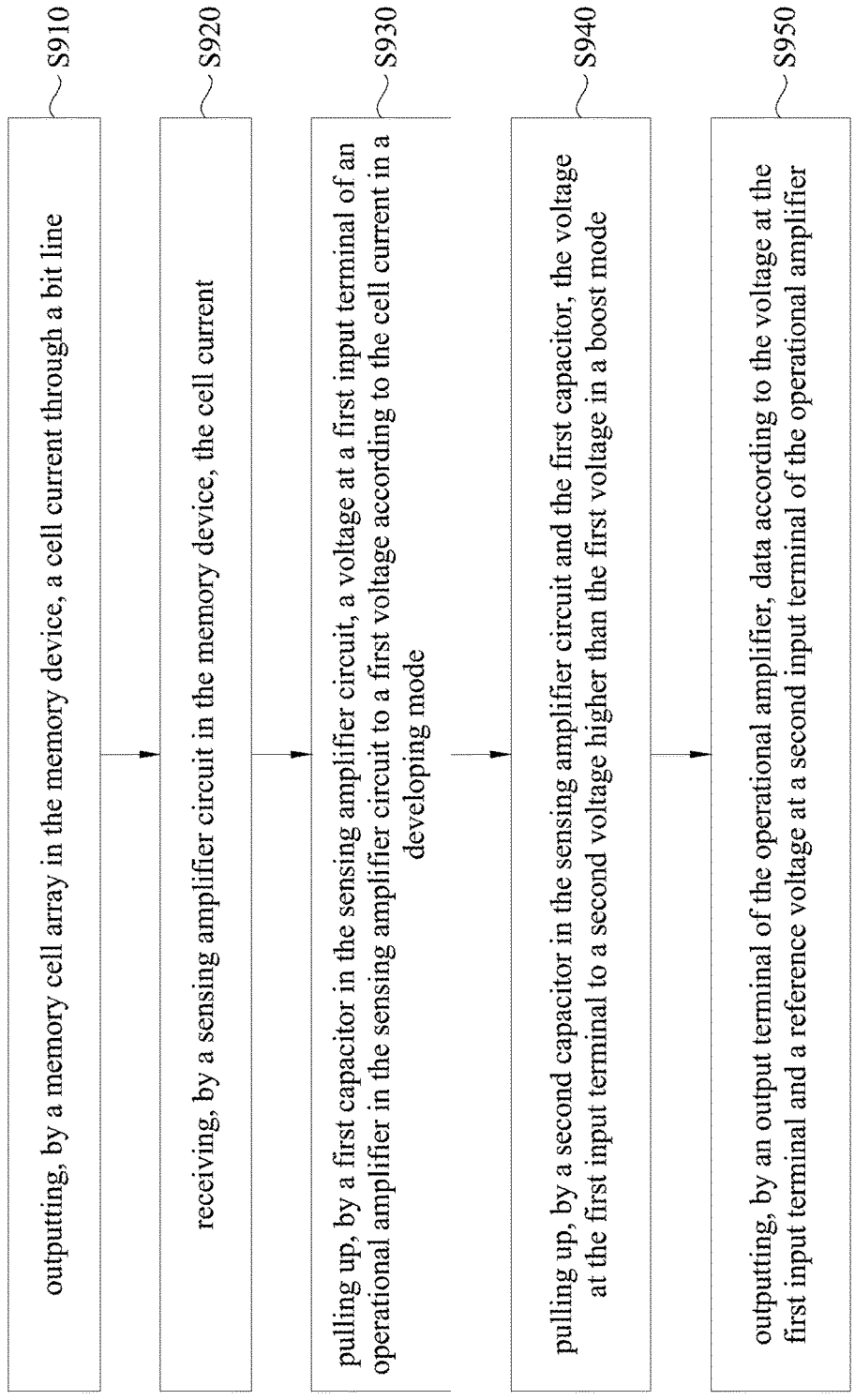
FIG. 9 is a flow diagram illustrating an operation method according to some embodiments of the present disclosure.

Reference is made to FIG. 9. FIG. 9 is a flow diagram illustrating an operation method 900 according to some embodiments of the present disclosure.

As illustrated in FIG. 9, the operation method 900 includes operation S910, operation S920, operation S930, operation S940, and operation S950. In some embodiments, the operation method 900 can be applied to the memory device 100, the memory device 600, or the memory device 700. For better understanding, the operation method 900 is described below with reference to the memory device 100 in FIG. 1 to FIG. 5, but the present disclosure in not limited thereto.

In operation S910, the memory cell array 110 outputs the cell current ICELL through the selected bit line. In the example of FIG. 1, the decoder 120 selects one of the bit lines BL1-BL8 to output the cell current ICELL from the selected bit line.

In operation S920, the sensing amplifier circuit 130 receives the cell current CELL. In the example of FIG. 1, the sensing amplifier circuit 130 receives the cell current ICELL from the selected bit line through the decoder 120.

In operation S930, the capacitor C1 pulls up the voltage DLI at the input terminal IN1 of the operational amplifier 131 to the first voltage V1 according to the cell current ICELL in the developing mode. In the example of FIG. 3, the cell current ICELL charges the input terminal IN1 through the turned-on switch S3 such that the voltage DLI at the input terminal IN1 increases to the first voltage V1.

In operation S940, the capacitor C2 and the capacitor C1 pull up the voltage DLI at the input terminal IN1 of the operational amplifier 131 to the higher second voltage V2 in the boost mode. In the example of FIG. 5, the charges stored in the capacitor C2 makes the voltage DLI at the input terminal IN1 increase to the higher second voltage V2 through the turned-on switch S2 and the capacitor C1.

In operation S950, the output terminal OUT of the operational amplifier 131 outputs the data DATA according to the voltage DLI at the input terminal IN1 and the reference voltage VREF at the input terminal IN2. In the example of FIG. 5, when the voltage DLI at the input terminal IN1 is higher than the reference voltage VREF at the input terminal IN2, the data DATA has a high logic value (e.g., a logic value 1). On the contrary, when the voltage DLI at the input terminal IN1 is equal to or less than the reference voltage VREF at the input terminal IN2, the data DATA has a low logic value (e.g., a logic value 0).

The other details about operation S910, operation S920, operation S930, operation S940, and operation S950 are described in the embodiments related to the memory device 100 in FIG. 1. Thus, they are not described herein again.

Based on the descriptions above, in the present disclosure, the reading speed of the memory device can be accelerated.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory device, comprising:
a memory cell array configured to output a cell current; and
a sensing amplifier circuit coupled to the memory cell array to receive the cell current and comprising:
an operational amplifier comprising a first input terminal, a second input terminal, and an output terminal, wherein the sensing amplifier circuit is configured to pull up a voltage at the first input terminal to a first voltage by a first capacitor according to the cell current in a developing mode, and pull up the voltage at the first input terminal to a second voltage higher than the first voltage in a boost mode after the developing mode by a second capacitor and the first capacitor,
wherein the output terminal is configured to output data according to the voltage at the first input terminal and a reference voltage at the second input terminal.

2. The memory device of claim 1, wherein the sensing amplifier circuit further comprises:
a control circuit comprising the first capacitor and the second capacitor and further comprising:
a first switch, wherein a first terminal of the first switch is coupled to the first input terminal;
a second switch, wherein a first terminal of the second switch is coupled to a second terminal of the first switch and a first terminal of the second capacitor at a first node, and a second terminal of the second switch is coupled to a terminal of the first capacitor at a second node, wherein a second terminal of the second capacitor is coupled to a ground terminal; and
a first transistor coupled between the terminal of the first capacitor and the ground terminal;
wherein in the developing mode, the first switch, and the first transistor are turned on, and the second switch are turned off.

3. The memory device of claim 2, wherein a capacitance value of the second capacitor is greater than a capacitance value of the first capacitor.

4. The memory device of claim 2, wherein the control circuit further comprises:
a second transistor coupled between the second terminal of the first switch and the ground terminal to form a reset path;
wherein in a reset mode before the developing mode, the first switch, the first transistor, and the second transistor are turned on, and the second switch is turned off.

5. The memory device of claim 2, wherein the control circuit further comprises a third switch coupled between the memory cell array and the first input terminal, wherein in an isolation mode between the developing mode and the boost mode, the first switch, the second switch, the third switch, and the first transistor are turned off.

6. The memory device of claim 5, wherein in the developing mode, the third switch is turned on, and in the boost mode, the third switch is turned off.

7. The memory device of claim 2, wherein in the boost mode, the second switch is turned on, and the first switch, and the first transistor are turned off.

8. The memory device of claim 2, wherein the control circuit further comprises:
a third switch coupled between the output terminal and the first input terminal;
wherein in a calibration mode between the reset mode and the developing mode, the third switch, and the first transistor are turned on, and the first switch, and the second switch are turned off.

9. The memory device of claim 2, wherein the memory cell array outputs the cell current through a selected bit line, and the control circuit further comprises:
a cancelling path coupled between the selected bit line and the ground terminal.

10. The memory device of claim 2, wherein the control circuit further comprising:
a multi-stage boost circuit coupled between the first terminal of the second capacitor and the first terminal of the second switch to pull up the voltage at the first input terminal to a third voltage higher than the second voltage.

11. The memory device of claim 10, wherein the multi-stage boost circuit comprising:
a plurality of stage circuits, wherein one of the plurality of stage circuits comprises:
a third switch coupled between the first input terminal and the first terminal of the second switch;
a third capacitor coupled between the first terminal of the second switch and the ground terminal, wherein the third capacitor and the third switch are coupled to the second switch at a third node; and
a second transistor coupled between the third capacitor and the ground terminal; and
a fourth switch, wherein a first terminal of the fourth switch is coupled to the first node through other of the plurality of stage circuits, and a second terminal of the fourth switch is coupled to a fourth node between the third capacitor and the second transistor.

12. The memory device of claim 10, wherein the memory cell array outputs the cell current through a selected bit line, and the control circuit further comprises:
a cancelling path coupled between the selected bit line and the ground terminal.

13. An operation method of a memory device, comprising:
outputting, by a memory cell array in the memory device, a cell current;
receiving, by a sensing amplifier circuit in the memory device, the cell current;
pulling up, by a first capacitor in the sensing amplifier circuit, a voltage at a first input terminal of an operational amplifier in the sensing amplifier circuit to a first voltage according to the cell current in a developing mode;
pulling up, by a second capacitor in the sensing amplifier circuit and the first capacitor, the voltage at the first input terminal to a second voltage higher than the first voltage in a boost mode after the developing mode; and
outputting, by an output terminal of the operational amplifier, data according to the voltage at the first input terminal and a reference voltage at a second input terminal of the operational amplifier.

14. The operation method of claim 13, wherein the sensing amplifier circuit further comprises:
a control circuit comprising the first capacitor and the second capacitor and further comprising:
a first switch, wherein a first terminal of the first switch is coupled to the first input terminal;
a second switch, wherein a first terminal of the second switch is coupled to a second terminal of the first switch and a first terminal of the second capacitor at a first node, and a second terminal of the second switch is coupled to a first terminal of the first capacitor at a second node, wherein a second terminal of the second capacitor is coupled to a ground terminal; and
a first transistor coupled between the second terminal of the first capacitor and the ground terminal.

15. The operation method of claim 14, further comprising:
turning on the first switch, and the first transistor in the developing mode; and
turning off the second switch in the developing mode.

16. The operation method of claim 14, further comprising:
turning on the second switch in the boost mode; and
turning off the first switch, and the first transistor in the boost mode.

17. The operation method of claim 14, further comprising:
turning off the first switch, the second switch, and the first transistor in an isolation mode between the developing mode and the boost mode.

18. The operation method of claim 14, further comprising:
turning on the first switch and the first transistor in a reset mode before the developing mode; and
turning off the second switch in the reset mode.

19. The operation method of claim 14, further comprising:
turning off the first switch and the second switch in a calibration mode before the developing mode; and
turning on the first transistor in the calibration mode.

20. The operation method of claim 14, wherein the control circuit further comprises:
a third switch coupled between the memory cell array and the first input terminal, wherein a second terminal of the first capacitor is coupled to the third switch at the first input terminal,
wherein the operation method further comprises:
turning on the third switch in the developing mode;
turning off the third switch in the boost mode; and
turning on the third switch in a calibration mode before the developing mode.

* * * * *